US008368109B2

(12) United States Patent
Iso et al.

(10) Patent No.: US 8,368,109 B2
(45) Date of Patent: Feb. 5, 2013

(54) LIGHT EMITTING DIODES WITH A P-TYPE SURFACE BONDED TO A TRANSPARENT SUBMOUNT TO INCREASE LIGHT EXTRACTION EFFICIENCY

(75) Inventors: Kenji Iso, Kanagawa (JP); Hirokuni Asamizu, Goleta, CA (US); Makoto Saito, Ibaraki (JP); Hitoshi Sato, Kanagawa (JP); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/296,611

(22) Filed: Nov. 15, 2011

(65) Prior Publication Data

US 2012/0056158 A1    Mar. 8, 2012

Related U.S. Application Data

(63) Continuation of application No. 12/181,100, filed on Jul. 28, 2008, now Pat. No. 8,124,991.

(60) Provisional application No. 60/952,044, filed on Jul. 26, 2007.

(51) Int. Cl.
*H01L 33/04* (2010.01)

(52) U.S. Cl. ............. 257/98; 257/94; 257/97; 257/103; 257/96; 257/99; 257/95; 257/E33.054; 257/E33.077; 257/E25.028; 257/E25.032

(58) Field of Classification Search .............. 257/23, 257/79, 103, 98, 99, 918, E51.018, E51.002, 257/E33.001, E33.077, E33.054, E25.032
See application file for complete search history.

(56) References Cited

U.S. PATENT DOCUMENTS

| | | | |
|---|---|---|---|
| 7,439,551 B2 | 10/2008 | Hata | |
| 7,687,813 B2 | 3/2010 | Nakamura et al. | |
| 7,781,789 B2 | 8/2010 | DenBaars et al. | |
| 7,868,341 B2 | 1/2011 | Diana et al. | |
| 7,956,371 B2 | 6/2011 | DenBaars et al. | |
| 7,994,527 B2 | 8/2011 | DenBaars et al. | |
| 8,022,423 B2 | 9/2011 | Nakamura et al. | |
| 2002/0117103 A1 | 8/2002 | Hooper et al. | |
| 2002/0121637 A1 | 9/2002 | Ito | |
| 2003/0075723 A1* | 4/2003 | Heremans et al. | 257/98 |
| 2005/0121688 A1* | 6/2005 | Nagai et al. | 257/99 |
| 2005/0145864 A1 | 7/2005 | Sugiyama et al. | |
| 2005/0205887 A1 | 9/2005 | Shei et al. | |
| 2005/0274970 A1 | 12/2005 | Ludowise | |
| 2007/0121690 A1 | 5/2007 | Fujii et al. | |
| 2008/0121918 A1 | 5/2008 | DenBaars et al. | |
| 2008/0128730 A1 | 6/2008 | Fellows et al. | |
| 2008/0149949 A1 | 6/2008 | Nakamura et al. | |
| 2008/0149959 A1 | 6/2008 | Nakamura et al. | |
| 2009/0121250 A1 | 5/2009 | DenBaars et al. | |

(Continued)

OTHER PUBLICATIONS

Fujii, T. et al., "Increase in the extraction efficiency of GaN-based light-emitting diodes via surface roughening," Appl. Phys. Lett., Feb. 9, 2004, pp. 855-857, vol. 84, No. 6.

(Continued)

*Primary Examiner* — Marc Armand
(74) *Attorney, Agent, or Firm* — Gates & Cooper LLP (57) ABSTRACT

An (Al,Ga,In)N-based light emitting diode (LED), comprising a p-type surface of the LED bonded with a transparent submount material to increase light extraction at the p-type surface, wherein the LED is a substrateless membrane.

18 Claims, 7 Drawing Sheets

U.S. PATENT DOCUMENTS

| | | |
|---|---|---|
| 2009/0146170 A1 | 6/2009 | Zhong et al. |
| 2009/0315055 A1 | 12/2009 | Tamboli et al. |
| 2010/0090240 A1 | 4/2010 | Tamboli et al. |
| 2010/0283078 A1 | 11/2010 | DenBaars et al. |
| 2010/0289043 A1 | 11/2010 | Aurelien et al. |
| 2011/0089455 A1 | 4/2011 | Diana et al. |

OTHER PUBLICATIONS

Kawakami, Y. et al., "Dimensionality of Excitons in InGaN-Based Light Emitting Devices," phys. stat. sol. (a), 2000, pp. 331-336, vol. 178.

Nakahara, K. et al., "Improved External Efficiency InGaN-Based Light-Emitting with Transparent Conductive Ga-Doped ZnO as p-Electrodes," Jpn. J. Appl. Phys., 2004, pp. L180-L182, vol. 43, No. 2A.

Nakamura, S. et al., "High-Brightness InGaN Blue, Green and Yellow Light Emitting Diodes with Quantum Well Structures," Jpn. J. Appl. Phys., Jul. 1, 1995, pp. L797-L799, vol. 32, Part 2, No. 7A.

Nishida, T. et al., "Efficient and high-power AlGaN-based ultraviolet light-emitting diode grown on bulk GaN," Appl. Phys. Lett, Aug. 6, 2001, pp. 711-712, vol. 79, No. 6.

PCT International Search Report for International Application No. PCT/US2008/071362, filed on Jul. 28, 2008.

* cited by examiner

LIGHT EMITTING DIODES WITH A P-TYPE SURFACE BONDED TO A TRANSPARENT SUBMOUNT TO INCREASE LIGHT EXTRACTION EFFICIENCY

CROSS-REFERENCE TO RELATED APPLICATION

This application is a continuation of and claims the benefit under 35 U.S.C. Section 120 of the following co-pending and commonly-assigned U.S. application:

U.S. Utility patent application Ser. No. 12/181,100, filed on Jul. 28, 2008, by Kenji Iso, Hirokuni Asamizu, Makoto Saito, Hitoshi Sato, Steven P. DenBaars, and Shuji Nakamura, entitled "LIGHT EMITTING DIODES WITH A P-TYPE SURFACE BONDED TO A TRANSPARENT SUBMOUNT TO INCREASE LIGHT EXTRACTION EFFICIENCY," which application claims the benefit under 35 U.S.C. Section 119(e) of commonly-assigned U.S. Provisional Patent Application Ser. No. 60/952,044, filed on Jul. 26, 2007, by Kenji Iso, Hirokuni Asamizu, Makoto Saito, Hitoshi Sato, Steven P. DenBaars, and Shuji Nakamura, entitled "LIGHT EMITTING DIODES WITH A P-TYPE SURFACE BONDED TO A TRANSPARENT SUBMOUNT TO INCREASE LIGHT EXTRACTION EFFICIENCY,"

which applications are incorporated by reference herein.

This application is related to the following co-pending and commonly-assigned application:

U.S. Utility patent application Ser. No. 10/581,940, filed on Jun. 7, 2006, now U.S. Pat. No. 7,704,763, issued Apr. 27, 2010, by Tetsuo Fujii, Yan Gao, Evelyn L. Hu, and Shuji Nakamura, and entitled "HIGHLY EFFICIENT GALLIUM NITRIDE BASED LIGHT EMITTING DIODES VIA SURFACE ROUGHENING," which application claims the benefit under 35 U.S.C. §365 of PCT International Patent Application Serial No. PCT/US2003/039211, filed on Dec. 9, 2003, by Tetsuo Fujii, Yan Gao, Evelyn L. Hu, and Shuji Nakamura, and entitled "HIGHLY EFFICIENT GALLIUM NITRIDE BASED LIGHT EMITTING DIODES VIA SURFACE ROUGHENING,";

both of which applications are incorporated by reference herein.

BACKGROUND OF THE INVENTION

1. Field of the Invention

This invention relates to light extraction from light emitting diodes (LEDs), and more specifically to an LED device layer structure and manufacturing method of the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Gallium nitride (GaN), and its ternary and quaternary compounds incorporating aluminum and indium (AlGaN, InGaN, AlInGaN), have become well established in the fabrication of wide band gap semiconductor light emitting diodes (LEDs) over the last 10 years. These compounds are referred to herein as Group III nitrides, or III-nitrides, or just nitrides, or by the nomenclature (Al,B,Ga,In)N. Devices made from these compounds are typically grown epitaxially using growth techniques including molecular beam epitaxy (MBE), metalorganic chemical vapor deposition (MOCVD), and hydride vapor phase epitaxy (HVPE).

The progress of III-nitride based LED development has brought about great changes in LED technology, with the realization of full-color LED displays, LED traffic signals, white LEDs, and so on. Recently, high-efficiency white LEDs have gained much interest as possible replacement for fluorescent lamps. Nonetheless, more improvement in efficiency is desirable.

There are two principal approaches for improving LED efficiency. The first approach involves increasing the internal quantum efficiency, which is determined by crystal quality and epitaxial layer structure, while the second approach involves increasing the light extraction efficiency. A typical internal quantum efficiency value for c-plane III-nitride blue LEDs is more than 70% [1]. An ultraviolet (UV) LED grown on a low-dislocation GaN substrate has recently exhibited an internal quantum efficiency value of about 80% [2]. There is little room for improvement of these values in the case of c-plane III-nitride LEDs.

On the other hand, there is plenty of room for improving the light extraction efficiency. A number of issues may be addressed in eliminating the internal loss of light, including: using high reflective mirror(s), low reflection surface(s) such as a roughened surface, a high thermal dispersion structure, etc.

The LED structure affects how much light is emitted. In order to increase the light output power from the front side of the LED, conventional LEDs are typically equipped with a mirror placed on the backside of the substrate, or a mirror coating on the lead frame. However, this reflected light is re-absorbed by the active region of the LED, because the photon energy of emitted light is almost same as the band-gap energy of the light emitting materials, such as AlInGaN multi quantum wells (MQWs). Due to this re-absorption of the emitted light by the active region, the net output power or the efficiency of the LED is decreased [3,4].

Therefore, to achieve highly output power efficiency of the LED, device structures in which re-absorption of the light is minimized are desirable. The present invention satisfies this need.

SUMMARY OF THE INVENTION

The present invention describes a device structure of an III-nitride light emitting diode (LED), in which light can be extracted from two surfaces of the LED before entering a shaped optical element and subsequently being extracted to air. In particular, the present invention minimizes the light re-absorption at the LED active region by eliminating light reflection at the p-type side surface of the LED chip.

To assist in minimizing internal absorption of the emitted light and to extract light from the side of p-type layer, transparent conductive materials, such as (but not limited to) indium tin oxide (ITO), zinc oxide (ZnO), tin oxide ($SnO_2$), or titanium oxide ($TiO_2$), are used as an ohmic electrode for a p-type semiconductor layer. In addition, the LED may be flip-chip bonded to a transparent substrate material, such as (but not limited to) glass, ZnO, $Ga_2O_3$, sapphire, or organic polymer.

To discourage internal light reflection and to scatter the light from the side of the n-type layer, an n-GaN surface is roughened by chemical etching. If the LED structure is grown on a substrate material other than bulk GaN, the n-GaN surface needs to be prepared by a laser lift-off (LLO) technique or by wet-etching of the substrate. Alternatively, the LED structure could be grown on a c-plane bulk GaN wafer.

The present invention discloses a light emitting device, comprising a light emitting diode (LED) structure comprised of an active layer positioned between at least a p-type layer and at least an n-type layer; and a transparent submount material bonded to a first surface of the LED structure near the p-type layer to increase light extraction at the first surface, wherein the transparent submount material is transparent to light emitted by the LED structure and reduces reflections of light occurring inside the LED structure.

The first surface may be a p-type surface. The first surface may be a p-type surface of a p-type electrode on the p-type layer, and the p-type electrode may be transparent to the light emitted by the LED structure. The transparent submount material may be bonded to the first surface of the LED structure using a transparent glue layer.

The transparent submount material may be electrically conductive. The transparent submount material may be an ohmic electrode for the p-type layer. The transparent submount material may be electrically insulating.

The reflections of the light occurring inside the LED structure may be total internal reflections and the transparent submount material may have a refractive index that reduces the total internal reflections at the first surface of the LED structure, thereby increasing extraction of the light through the first surface of the LED structure and into the transparent submount material.

A second surface of the LED structure near the n-type layer may be textured to enhance light extraction from the second surface of the LED structure. The second surface may have an N-face. The second surface of the LED structure may be exposed after removal of a substrate upon which the LED structure is grown. The LED structure may be a substrate-less membrane.

The present invention further discloses a method for fabricating a light emitting device, comprising creating a light emitting diode (LED) structure comprised of an active layer positioned between at least a p-type layer and at least an n-type layer; and bonding a transparent submount material to a first surface of the LED structure near the p-type layer to increase light extraction at the first surface, wherein the transparent submount material is transparent to light emitted by the LED structure and reduces reflections of light occurring inside the LED structure.

The present invention further discloses a method for increasing light extraction from a light emitting device, comprising emitting light from a light emitting diode (LED) structure comprised of an active layer positioned between at least a p-type layer and at least an n-type layer; and extracting the light from the LED structure through a transparent submount material bonded to a first surface of the LED structure near the p-type layer, wherein the transparent submount material is transparent to light emitted by the LED structure and reduces reflections of light occurring inside the LED structure.

BRIEF DESCRIPTION OF THE DRAWINGS

Referring now to the drawings in which like reference numbers represent corresponding parts throughout:

FIGS. 4(a) and 4(b) are scanning electron micrograph (SEM) images of the N-face of GaN with a cross-shaped n-electrode, wherein the LED is bonded on a glass submount, wherein FIG. 4(b) shows that the chemically etched N-face GaN surface comprises a plurality hexagonal shaped cones, FIG. 4(a) has a scale bar of 200 microns and FIG. 4(b) has scale bar of 10 microns.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention provides a means of increasing the extraction efficiency by bonding transparent substrate material to the p-type contact layer of GaN based LEDs with transparent electrode(s). This structure reduces light reflections occurring repeatedly inside the LED, and thus extracts more light out of the LED.

Technical Description

LED Structure

FIG. 1(a), FIG. 1(b), FIG. 1(c) and FIG. 1(d) are schematics of transparent LEDs. The LED in FIG. 1(a) comprises an n-type electrode 30, n-type layer 32, active region 34, p-type layer 36, p-type transparent electrode 38 with partial metal pad 40, and a current blocking layer 42, wherein the p-type electrode 38 is bonded via a transparent glue layer 44 to an insulating and transparent submount 46.

Figure 1A:
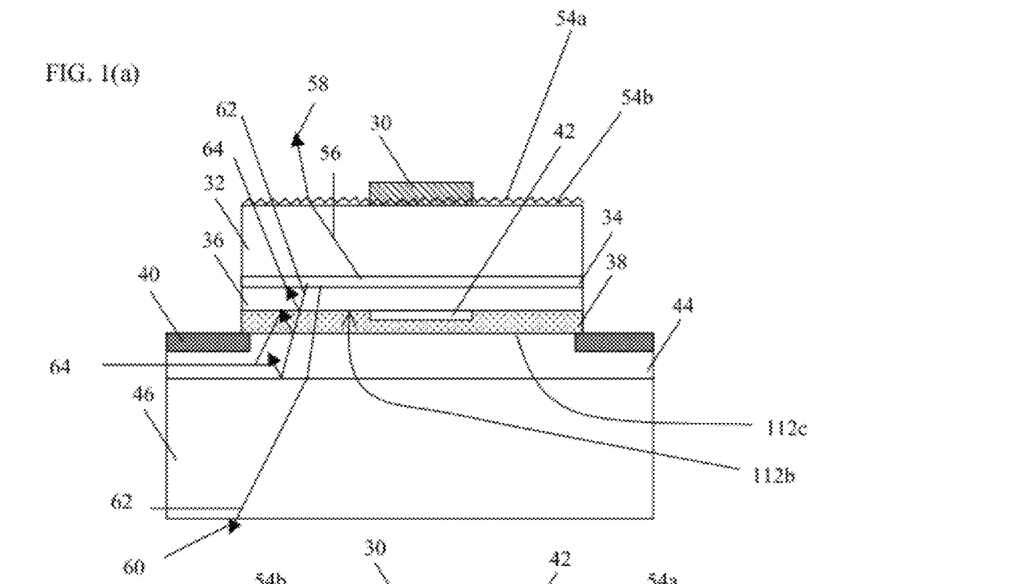
FIG. 1(a), FIG. 1(b), FIG. 1(c) and FIG. 1(d) are schematics of transparent LEDs.
Figure 1B:
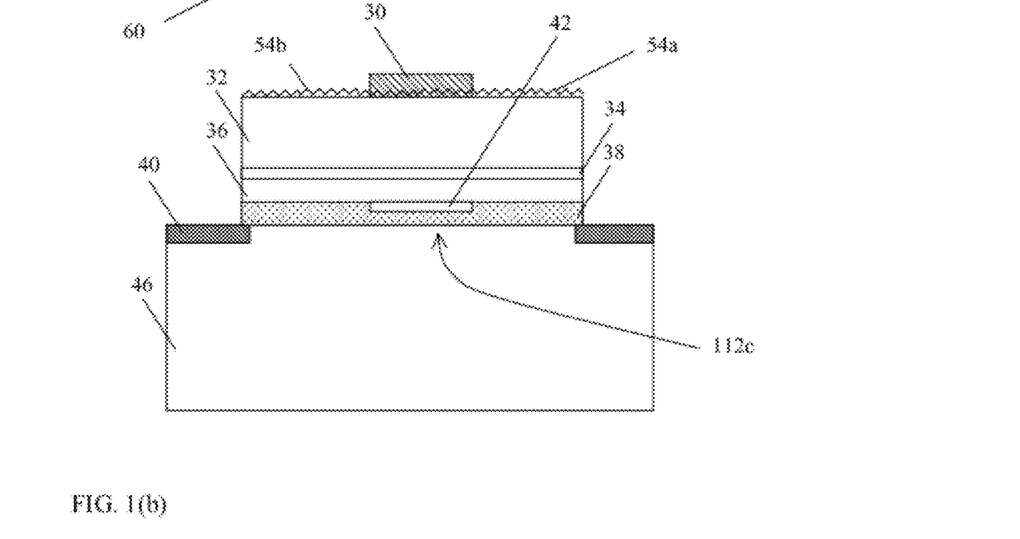

The LED in FIG. 1(b) comprises an n-type electrode 30, n-type layer 32, active region 34, p-type layer 36, p-type transparent electrode 38 with partial metal pad 40, and current blocking layer 42, wherein the p-type electrode 38 is directly bonded to an insulating and transparent submount 46.

Figure 1C:
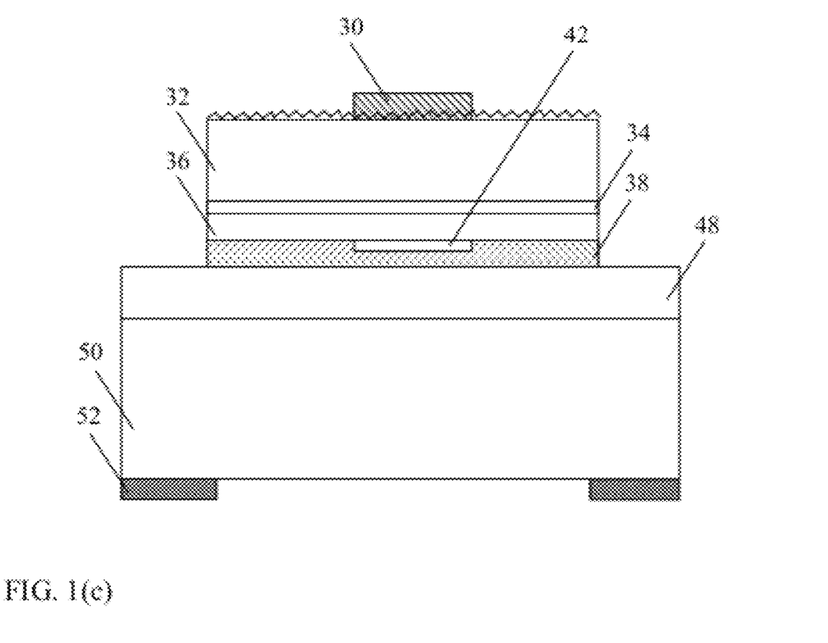

The LED in FIG. 1(c) comprises an n-type electrode 30, n-type layer 32, active region 34, p-type layer 36, p-type transparent electrode 38, and the current blocking layer 42, wherein the p-type electrode 38 is bonded via an electrically conductive and transparent glue layer 48 to an electrically conductive and transparent submount 50 with partial metal pad 52.

Figure 1D:
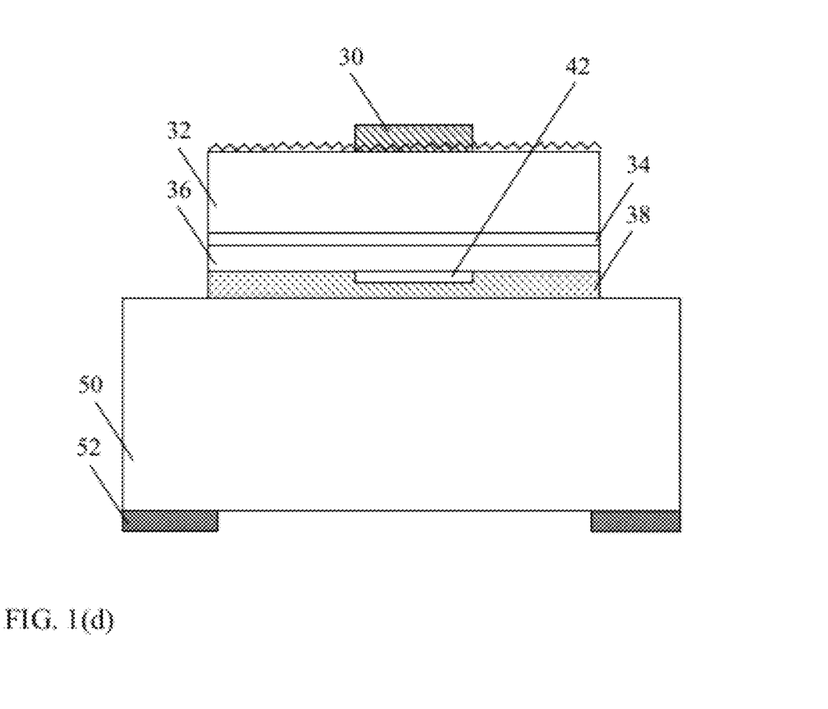

The LED in FIG. 1(d) comprises an n-type electrode 30, n-type layer 32, active region 34, p-type layer 36, p-type transparent electrode 38 and the current blocking layer 42, wherein the p-type electrode 38 is directly bonded to an electrically conductive and transparent submount 50.

In each instance, the n-type layer 32, active region 34 and p-type layer 36 are comprised of a (B, Al, Ga, In)N alloy. A chemical etching method may be used to roughen 54a the surface 54b of the n-type layer 32. Prior to roughening 54a, the n-type GaN surface 54b needs to be exposed by a laser-liftoff (LLO) technique, or alternatively, the LED structure could be grown on a bulk GaN wafer (not shown). The light 56 emitted from the active region 34 towards the roughened n-type GaN surface 54a is scattered 58 by the surface 54a, which does not reflect the light 56 back to the active region 34. It is desired that the p-type electrode 38 have a property of high transparency to decrease light absorption and to increase light extraction 60 of the light 62 emitted by the active region 34 towards the transparent submount 46, 50, thereby reducing reflection(s) 64 of the light 62.

Processing Steps

Figure 2:
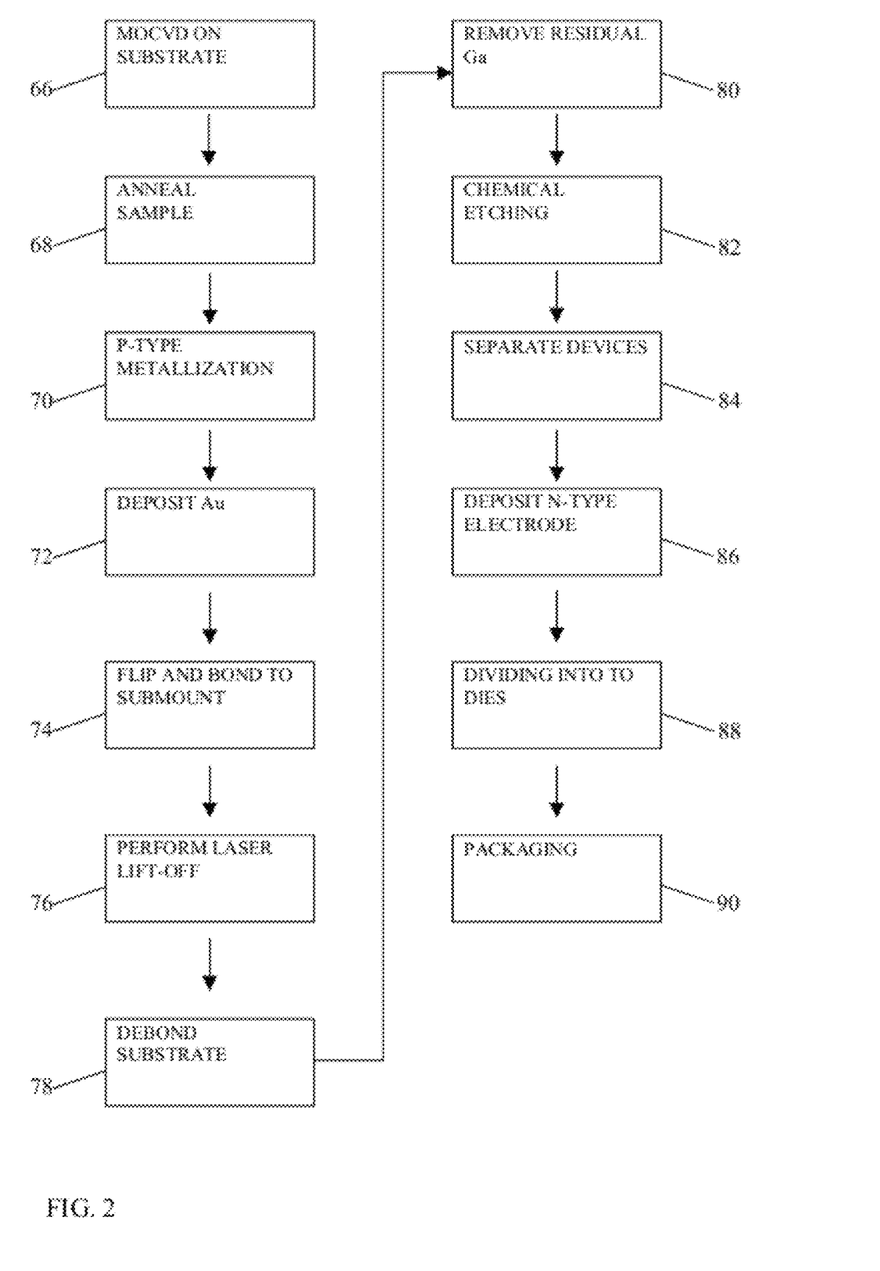
FIG. 2 is a flowchart that illustrates the processing steps used in the preferred embodiment of the present invention.

FIG. 2 is a flowchart that illustrates the processing steps used in the preferred embodiment of the present invention.

Block 66 represents the step of growing Ga-face epitaxial layers on a c-plane sapphire substrate by Metalorganic Chemical Vapor Deposition (MOCVD), thereby creating a sample, such as an LED structure.

Block 68 represents the step of annealing the sample for p-type activation, after the MOCVD.

Block 70 represents the step of performing p-type metallization, such as a p-type ohmic contact fabrication process on the sample to create a highly transparent p-GaN contact.

Block 72 represents the step of depositing thick metal pad layers on the sample, for example depositing Au.

Block 74 represents the step of flipping the sample and bonding it to a transparent submount (46, 50 in FIGS. 1(*a*)-1(*d*)). The submount 46, 50 requires optical transparency for the corresponding light wavelength. Both an electrically conductive material and an insulating material are used for this submount. For the electrically conductive submount 50, some examples comprise, but are not limited to, Indium-tin oxide (ITO), zinc oxide (ZnO), tin oxide ($SnO_2$), titanium oxide ($TiO_2$), and electrically conductive polymer. For the insulating submount 46, some examples comprise, but are not limited to, Silicon oxide, Polycarbonate, Poly methyl methacrylate, Poly methyl acrylate, MS resin (methyl methacrylate)-(styrene) copolymer, polypropylene, ABS resin (Acrylonitrile)-(Butadiene)-(Styrene) copolymer, polystyrene, epoxy resin, polysulfone, polyethersulfone, nylon resin, polyethylene terephthalate, polypropylene terephthalate and polybutylene terephthalate. The sample is bonded to the submount 46, 50 by fusing/melting the submount or using a transparent glue such as polymer.

Block 76 represents the step of performing an LLO process by irradiating the sapphire substrate of the sample using krypton fluoride (KrF) eximer laser light (248 nm) through the backside of the sapphire substrate, resulting in local decomposition of the GaN at the GaN/sapphire substrate interface. Specifically, by rastering the KrF eximer laser spot over the sample, the GaN-based LED membrane is transferred to the transparent submount.

Block 78 represents the step of debonding the sapphire substrate from the sample, after rastering the KrF laser over the sample.

Block 80 represents the step of removing any residual Ga droplets on the detached GaN surface of the sample using a hydrochloride (HCl) solution.

Block 82 represents the step of chemical etching by immersing the sample in an electrolyte solution of potassium hydroxide (KOH), in such a way that the top surface is roughened. This step of roughening the surface is not necessarily needed. However the roughened surface reduces light reflections occurring repeatedly inside the LED, and thus extracts more light out of the LED.

Block 84 represents the step of separating each device on the transparent substrate of the sample using a dry etching method.

Block 86 represents the step of depositing an electrode as an n-type contact or electrode on the exposed N-face GaN of the sample.

Block 88 represents the step of dividing the sample into dies using a dicing or cleaving method.

Block 90 represents the step of packaging by wire-bonding and encapsulation of the die by sealing with resin.

FIG. 3(*a*), FIG. 3(*b*), FIG. 3(*c*), FIG. 3(*d*), FIG. 3(*e*), and FIG. 3(*f*) further illustrate the fabrication steps for the LEDs bonded to a transparent substrate 92 via transparent p-electrode 94, with roughening 96 of n-GaN surface 98, wherein the LED structure may comprise a metal p-type pad 100, a p-type electrode 94, a GaN-based LED membrane 102, sapphire substrate 104, transparent glue 106, transparent submount 92 and n-type electrode 108.

Specifically, FIG. 3(*a*) shows the results after the metal p-type pad electrode 100 and the transparent p-type electrode 94 deposition on the LED 102, and FIG. 3(*b*) shows the results after the LED 102 is bonded onto the transparent substrate 92 via transparent glue 106. FIG. 3(*c*) shows the results after the sapphire substrate 104 removal by LLO, FIG. 3(*d*) shows the results after the roughening 96 of the GaN surface 98, FIG. 3(*e*) shows the results after device isolation and FIG. 3(*f*) shows the results after the n-type electrode 108 deposition.

Possible Modifications and Variations

Although GaN devices are referred to throughout this specification, persons of ordinary skill in the art will recognize that other Group III nitride devices, i.e., (Al,B,Ga,In)N devices may be provided as well. Moreover, the present invention is not limited to III-nitride devices, and may be used with other LEDs as well, such as GaP, GaAs, or organic based LEDs.

At present, III-nitride devices can be also grown on SiC and Si substrates. If an III nitride-based LED is grown on SiC or Si, conventional dry etching or wet etching can remove the substrate, instead of the LLO process. By utilizing a bulk III nitride substrate, the LLO process can be eliminated.

Experimental Results

In experiments performed in the present invention, Ga-face epitaxial layers were grown on a c-plane sapphire substrate by MOCVD. The structure comprised of 4 μm-thick Si-doped GaN layers, a 6-period GaN/InGaN multi-quantum-well (MQW), a 15 nm-thick undoped $Al_{0.15}Ga_{0.85}N$ layer, and 0.2 μm-thick Mg-doped GaN. After the crystal growth of the LED structure, the sample was annealed for p-type activation and subsequently a p-type metallization process was performed. A 150 nm thick circular $SiO_2$ current blocking layer was deposited using an e-beam evaporator. An Indium tin oxide (ITO) electrode was deposited by using an $In_2O_3$— 10 wt % in $SnO_2$ target, and subsequently sintered to increase film transparency, to decrease sheet resistance, and to reduce contact resistance for the Mg-doped p-GaN layer. Then, an array of the stripe Ni/Au bonding pads was fabricated by a conventional deposition and lift-off technique. The wafer was flipped and bonded to a glass submount by using epoxy resin, and was sufficiently dried. A KrF laser (emitting at a wavelength of 248 nm) was used for the laser lift off (LLO) process, in which the laser light was transmitted through the transparent sapphire substrate and was absorbed at the interface between the GaN epitaxial layer and the sapphire, subsequently causing the decomposition of the GaN. After rastering the KrF laser over the sample, the sapphire substrate was debonded from the LED epilayer. The remaining Ga droplets on the n-GaN surface were removed by a concentrated HCl solution. In order to achieve the n-GaN surface roughening, the sample was etched in a heated concentrated KOH solution. Next, reactive ion etching (RIE) was performed to divide each device from its neighbors and to simultaneously expose the Ni/Au pad layer under the LED epilayer. Then, n-contact metals (Ti/Al/Au, i.e., Al sandwiched between Ti and Au, wherein Ti has a thickness of 10 nm, Al has a thickness of 50 nm, and Au has a thickness of 300 nm) were deposited on the roughened n-GaN surface. After dividing the sample into dies using a dicing or cleaving method, gold-wire bonding was performed. Finally silicone resin was applied to form a lamp and lead frame assembly, and the assembly was placed in an oven to cure the silicone resin.

Figure 4A:
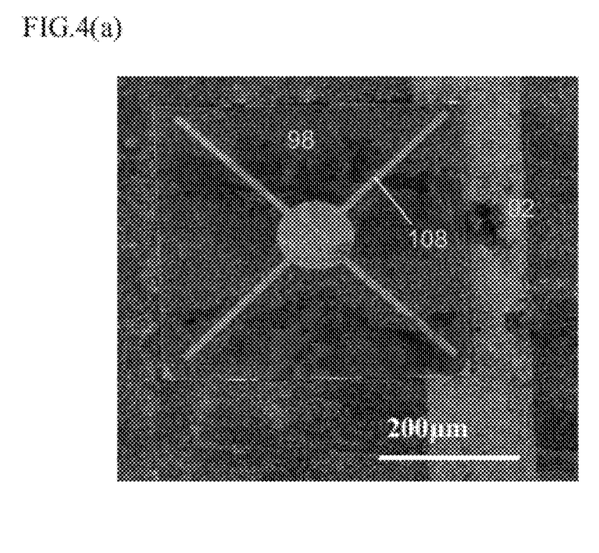
Figure 4B:
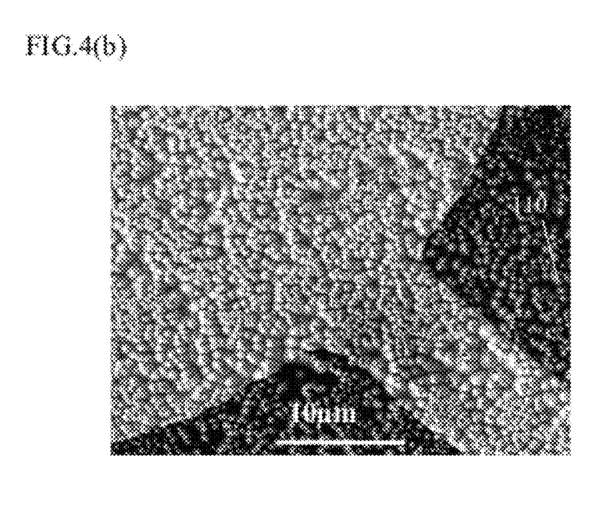

FIGS. 4(a) and 4(b) are scanning electron micrograph (SEM) images of the N-face of GaN 98 with a cross-shaped n-electrode 108, wherein the LED is bonded on a glass submount 92. FIG. 4(b) shows that the chemically etched N-face GaN surface comprises a plurality hexagonal shaped cones 110.

Figure 5:
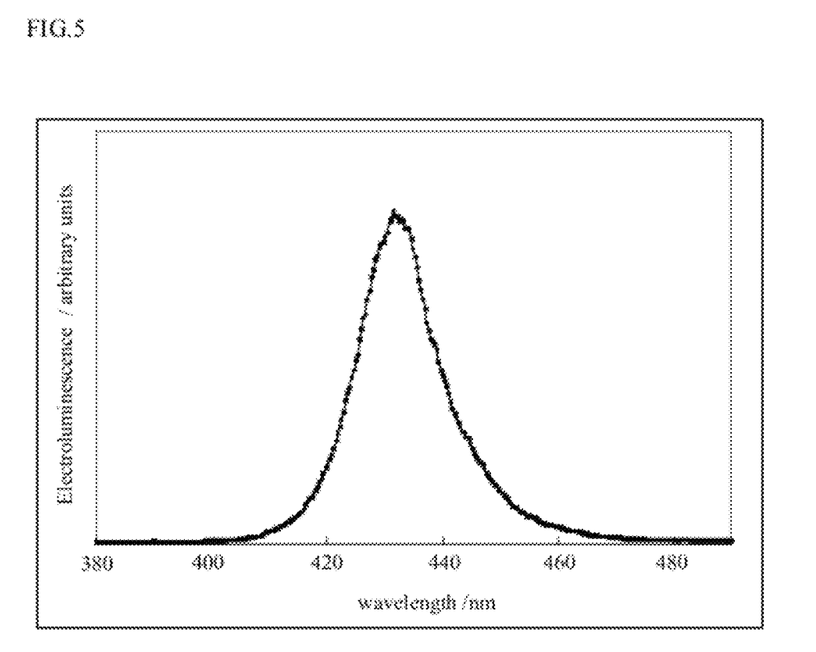
FIG. 5 shows an electroluminescence (EL) spectrum from a transparent LED of the present invention, wherein EL is plotted as a function of wavelength of the EL.

An electroluminescence (EL) spectrum from a transparent LED is shown in FIG. 5. The measurement was performed at a forward current density of 12 A/cm$^2$ DC at room temperature. No longitudinal mode was observed in FIG. 5. This means a transparent submount and a plurality hexagonal shaped cones suppress the resonance in the vertical GaN cavity.

Figure 6:
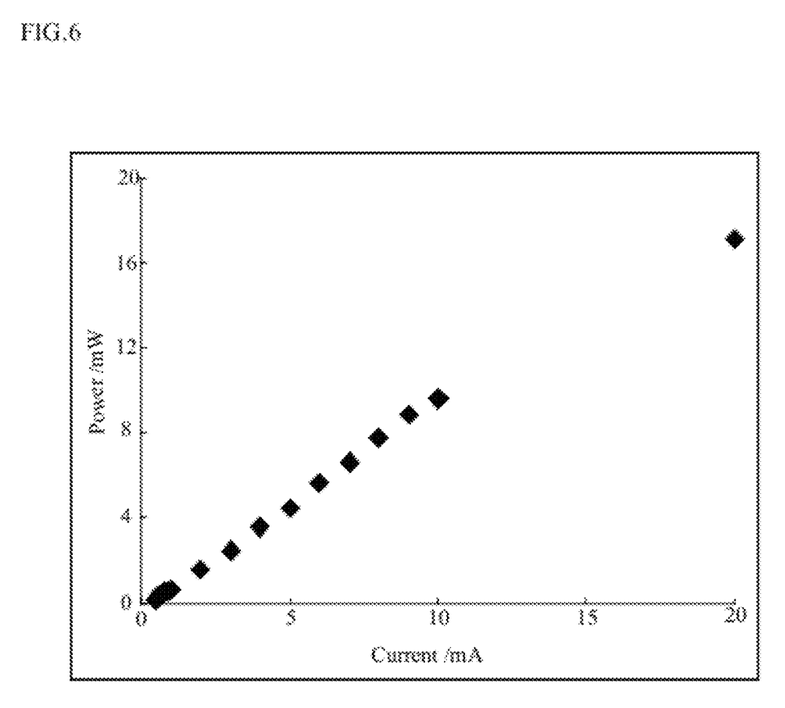
FIG. 6 is a graph of upward EL output power vs. DC injection current (L-I) characteristic at room temperature, wherein the output power at 20 mA was 17.7 mW.

FIG. 6 is a graph of upward EL output power vs. DC injection current (L-I) characteristic at room temperature. The output power at 20 mA was 17.7 mW.

Summary

In summary, a transparent submount and a plurality of hexagonal shaped cones are applied to opposite sides or surfaces of a GaN based LED for the purpose of increasing extraction efficiency. This enables light extraction from a p-GaN side and an n-GaN side of the LED without light re-absorption, thereby increasing light extraction efficiency. It is notable that the technique described herein is simple and does not require complicated processing.

For example, FIGS. 1(a)-1(d) and FIGS. 3(a)-3(f) illustrate a light emitting device, comprising a light emitting diode (LED) structure 102 comprised of an active layer 34 (for emitting light 56,62) positioned between at least a p-type layer 36 and at least an n-type layer 32; and a transparent submount material (46, 50, or 92) bonded to a first surface (or side) (e.g. 112a, 112b, or 112c) of the LED structure 102 near the p-type layer 36 to increase light extraction 60 at the first surface (or side) (112a,112b, or 112c), wherein the transparent submount material (e.g. 46, 50, or 92) is transparent to light 56, 62 emitted by the LED structure 102 and reduces reflections 64 of light 62 occurring inside the LED structure 102.

The p-type layer 36, active layer 34, and n-type layer 32 may comprise III-nitride compounds, for example.

The first surface 112a may be a p-type surface which may contact or interface the transparent submount material 46 or 50. The first surface 112a is not limited to a particular surface near the p-type layer 36. For example, the first surface 112a may be a p-type surface 112b of the p-type layer 36. For example, the first surface 112a may be a p-type surface 112c of a p-type electrode 38 on the p-type layer 36, and the p-type electrode 38 may be transparent to the light 56,62 emitted by the LED structure 102.

The transparent submount material 50 or 46 may be bonded to the first surface 112c of the LED structure 102 using a transparent glue layer 48. The p-type electrode 38 may form an interface with the transparent submount material 50 or 46.

The transparent submount material 50 may be electrically conductive. The transparent submount material 50 may be an ohmic electrode for the p-type layer 36, and therefore the transparent submount may be electrically connected to the p-type layer 36 and/or p-type electrode 38.

The transparent submount material 46 may be electrically insulating. The reflection(s) 64 of the light 62 occurring inside the LED structure 102 may be total internal reflection(s) and the transparent submount material 46 may have a refractive index that reduces the total internal reflection(s) at the first surface (112a, 112b, or 112c) of the LED structure 102, thereby increasing extraction 60 of the light 62 from the first surface (112a, 112b, or 112c) of the LED structure 102 and into the transparent submount (46 or 50) to exit the LED.

The second surface (or side) 98 of the LED structure 102 near the n-type layer 32 may be textured (e.g. roughened) to enhance extraction of the light 56 emitted by the active layer 34 from the second surface (or side) 98 of the LED structure 102 (as compared to without the roughening). For example, the second surface 98 may be an n-type surface which is textured 96, 54a. The second surface 98 may have an N-face. The N-face of the second surface 98 may be prepared by a laser lift off (LLO) technique.

Figure 3A:
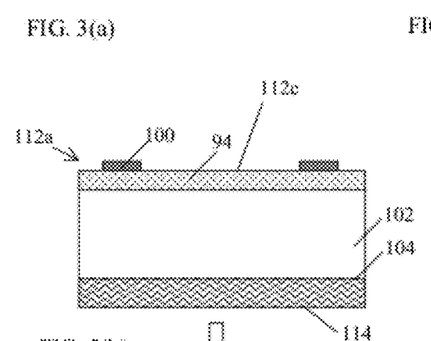
FIG. 3(a), FIG. 3(b), FIG. 3(c), FIG. 3(d), FIG. 3(e), and FIG. 3(f) are schematics further illustrating the fabrication steps for the LEDs bonded to a transparent substrate via a transparent p-electrode, with roughening of an n-GaN surface, wherein the LED structure includes a metal p-type pad, a p-type electrode, a GaN-based LED membrane, sapphire substrate, transparent glue, transparent submount and n-type electrode.
Figure 3B:
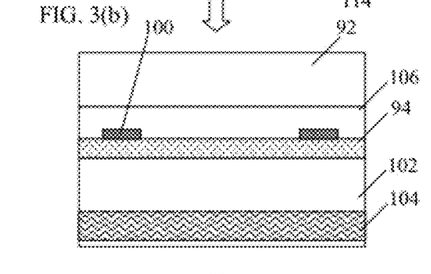
Figure 3C:
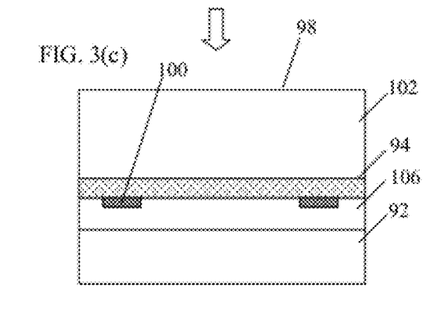
Figure 3D:
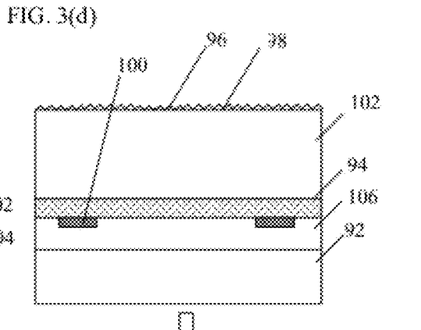
Figure 3E:
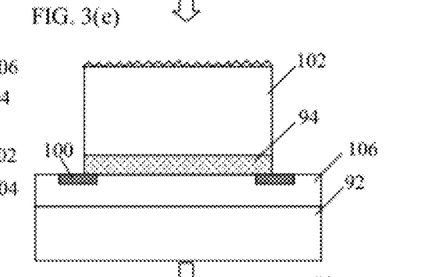
Figure 3F:
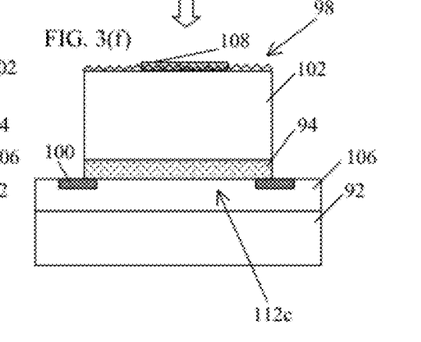

The LED structure 102 may be substrate-less, for example an LED membrane or film, prepared using any suitable technique, although typically the second surface 98 is a surface 98 of the LED structure 102 exposed after/by removal of a substrate 104 upon which the LED structure 102 is grown (the substrate 104 may be any substrate suitable for III-nitride growth, for example). If the substrate 104 is a GaN substrate, the second surface (or side) 98 may be the surface 114 of the substrate 104, and the substrate 104 may be thinned. Thus, the second surface (e.g. 98, 114, or 54b) is not limited to a particular surface near the n-type layer 32—the surface 98 could be the surface 54b of the n-type layer 32, surface 98 of the LED structure 102, or surface 114 of the substrate 104, for example.

FIGS. 3(a)-3(f) illustrate a method for fabricating a III-nitride based LED (e.g. GaN based), comprising attaching (e.g. bonding) or optically coupling the first side 112a of the LED structure 102 to a transparent submount 92.

The LED structure 102 may be grown in any orientation, for example, in a Ga-face direction on the substrate 104, such that the n-type layer of the LED has an N-face, the second side 98 is an N-face, and the first side 112a is a Ga face.

References

The following references are incorporated by reference herein:

1. Phys. Stat. Sol. (a) 178, 331 (2000).

2. Appl. Phys. Lett. 79, 711 (2001).

3. J. J. Appl. Phys. 34, L797-99 (1995).

4. J. J. Appl. Phys. 43, L180-182 (2004).

5. Tetsuo Fujii Appl Phys. Lett. 84(6), by Tetsuo Fujii, pp. 855-857, Feb. 9, 2004.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light emitting device structure, comprising:
a III-nitride based light emitting diode (LED) structure grown on an n-type Gallium Nitride (GaN) substrate, wherein:
the LED structure comprises a III-nitride active layer positioned between at least a III-nitride p-type layer and at least a III-nitride n-type layer,
a p-type electrode is deposited on or above the III-nitride p-type layer,
the p-type electrode is transparent to the light emitted by the III-nitride LED structure,
a submount, transparent to the light emitted by the LED structure, is attached to the p-type electrode,
the GaN substrate is shaped to increase extraction of a first portion of light, emitted by the LED structure, from the GaN substrate and a first side of the light emitting device structure,
a second portion of the light, emitted by the LED structure, is emitted from a second side of the light emitting device structure, and
the GaN substrate is between the first side and the LED structure and the LED structure is between the second side and the GaN substrate.

2. The device structure of claim 1, wherein the light exiting from the light emitting device structure has a power of at least 17.7 milliwatts at a drive current to the LED structure of 20 milliamps.

3. The device structure of claim 1, wherein the shaped GaN substrate comprises a roughened or etched surface of the GaN substrate.

4. The device structure of claim 1, wherein the LED structure is a substrate-less membrane.

5. The device structure of claim 1, wherein the submount is electrically conductive.

6. The device structure of claim 1, wherein the submount is an ohmic electrode for a p-type layer of the III-nitride LED structure.

7. The device structure of claim 1, wherein the submount is electrically insulating.

8. The device structure of claim 1, wherein the submount comprises glass.

9. The device structure of claim 1, wherein the submount comprises Zinc Oxide.

10. The device structure of claim 1, wherein the submount comprises Indium-tin oxide (ITO), tin oxide ($SnO_2$), titanium oxide ($TiO_2$), or an electrically conductive polymer.

11. The device structure of claim 2, wherein the LED structure includes an indium containing light emitting active layer or a light emitting active layer including InGaN.

12. The device structure of claim 3, wherein the roughened surface is an (N-face) of the GaN substrate.

13. The device structure of claim 11, wherein the LED structure emits the light that is blue light or the light having a peak intensity in a blue wavelength range.

14. A method of fabricating a light emitting device structure, comprising:
growing a light emitting diode (LED) structure on an n-type Gallium Nitride (GaN) substrate;
depositing a p-type electrode on a p-type layer of the LED structure, wherein the p-type layer is transparent to the light emitted by the LED structure;
attaching the LED structure to a Zinc Oxide submount; and
shaping etching the GaN substrate to increase extraction of
a first portion of light, emitted by the LED structure, from the Gallium Nitride substrate and a first side of the light emitting device structure, wherein:
a second portion of the light, emitted by the LED structure, is emitted from a second side of the light emitting device structure, and
the Gallium Nitride substrate is between the first side and the LED structure and the LED structure is between the second side and the Gallium Nitride substrate.

15. The method of claim 14, further comprising:
removing at least a portion of the substrate and etching the GaN substrate to shape the GaN substrate.

16. A light emitting device structure, comprising;
a Gallium Nitride (GaN) substrate;
a light emitting diode (LED) Structure grown on or above the GaN substrate; and
a p-type electrode on or above the LED structure, wherein:
light emitted by the LED structure is extracted through the p-type electrode and the GaN substrate, and
a backside surface of the GaN substrate is shaped to increase extraction of the light from the substrate.

17. The light emitting device structure of claim 16, wherein;
the LED structure is III-nitride based,
a portion of the substrate is shaped to increase the extraction of the light from the substrate, and
a submount is attached to a p-type side of the light emitting device structure.

18. The device structure of claim 16, wherein the substrate is n-type GaN.

* * * * *